(12) United States Patent
Bi et al.

(10) Patent No.: US 9,824,934 B1
(45) Date of Patent: Nov. 21, 2017

(54) SHALLOW TRENCH ISOLATION RECESS PROCESS FLOW FOR VERTICAL FIELD EFFECT TRANSISTOR FABRICATION

(71) Applicant: International Business Machines Corporation, Armonk, NY (US)

(72) Inventors: Zhenxing Bi, Niskayuna, NY (US); Kangguo Cheng, Schenectady, NY (US); Bruce Miao, Loudonville, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/282,378

(22) Filed: Sep. 30, 2016

(51) Int. Cl.
*H01L 21/8234* (2006.01)
*H01L 21/762* (2006.01)
*H01L 27/088* (2006.01)

(52) U.S. Cl.
CPC ........... *H01L 21/823487* (2013.01); *H01L 21/76229* (2013.01); *H01L 21/823481* (2013.01); *H01L 27/088* (2013.01)

(58) Field of Classification Search
CPC . H01L 51/5206; H01L 51/5092; H01L 51/56; H01L 51/5072; H01L 27/3276
See application file for complete search history.

(56) References Cited

U.S. PATENT DOCUMENTS

| | | |
|---|---|---|
| 6,414,347 B1 | 7/2002 | Divakaruni et al. |
| 6,642,090 B1 | 11/2003 | Fried et al. |
| 8,354,320 B1 | 1/2013 | Xie et al. |
| 8,384,187 B2 * | 2/2013 | Sawada ............ H01L 21/76229 257/506 |
| 8,697,522 B2 | 4/2014 | Cheng et al. |
| 9,418,994 B1 * | 8/2016 | Chao ................... H01L 27/0886 |
| 2011/0260282 A1 | 10/2011 | Kawasaki |
| 2012/0032267 A1 | 2/2012 | Cheng et al. |
| 2012/0193751 A1 | 8/2012 | Kawasaki et al. |

(Continued)

OTHER PUBLICATIONS

A. Redolfi et al., "Bulk FinFET Fabrication with New Approaches for Oxide Topography Control Using Dry Removal Techniques," 12th International Conference on Ultimate Integration on Silicon (ULIS), Mar. 2011, pp. 1-3, Cork, Ireland.

(Continued)

*Primary Examiner* — Kyoung Lee
*Assistant Examiner* — Christina Sylvia
(74) *Attorney, Agent, or Firm* — Vazken Alexanian; Ryan, Mason & Lewis, LLP

(57) ABSTRACT

A semiconductor device includes structures formed in first and second regions of a semiconductor substrate. The structures in the first region are spaced with a pitch P. The first and second regions are separated by an isolation region with spacing S, wherein S is greater than P. A first insulating layer is deposited and recessed to a target depth in the first region, and to a second depth in the isolation region. The second depth is lower than the target depth. A first etch stop layer is formed over the recessed first insulating layer, and a second insulating layer is formed over the first etch stop layer to increase a level of insulating material in the isolation region to the same target depth in the first device region. The recessed first insulating layer, first etch stop layer, and second insulating layer form a uniform thickness shallow trench isolation layer.

18 Claims, 15 Drawing Sheets

(56) References Cited

U.S. PATENT DOCUMENTS

2014/0131776 A1 5/2014 Ching et al.
2014/0203376 A1 7/2014 Xie et al.
2014/0264594 A1 9/2014 Adam et al.
2014/0327088 A1 11/2014 Cai et al.

OTHER PUBLICATIONS

L. Du et al., "Optimization of STI Oxide Recess Uniformity for FinFET Beyond 20nm," China Semiconductor Technology International Conference (CSTIC), Mar. 2015, pp. 1-4, Shanghai, China.
K. Cheng et al., "Bottom Oxidation Through STI (BOTS)—A Novel Approach to Fabricate Dielectric Isolated FinFETS on Bulk Substrates," Symposium on VLSI Technology: Digest of Technical Papers, Jun. 2014, pp. 1-2, Honolulu, Hawaii.
List of IBM Patents or Patent Applications Treated as Related.

\* cited by examiner

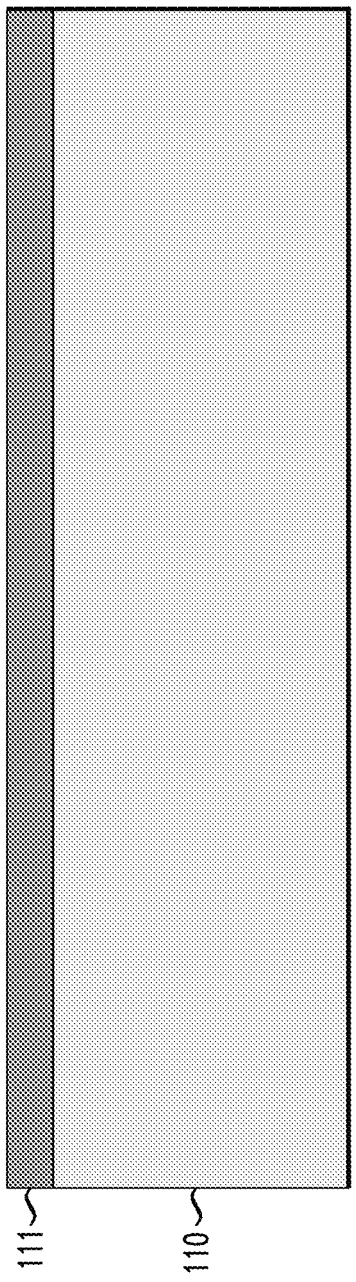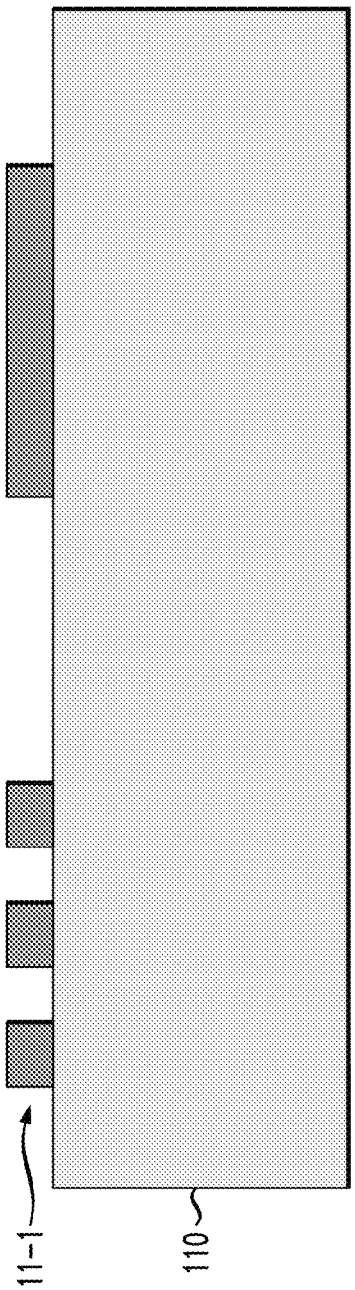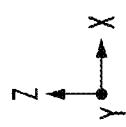

US 9,824,934 B1

SHALLOW TRENCH ISOLATION RECESS PROCESS FLOW FOR VERTICAL FIELD EFFECT TRANSISTOR FABRICATION

TECHNICAL FIELD

This disclosure relates generally to semiconductor fabrication techniques and, in particular, to structures and methods for fabricating shallow trench isolation structures for semiconductor integrated circuit devices.

BACKGROUND

A shallow trench isolation (STI) structure comprises insulating material which is deposited and patterned on a semiconductor substrate to electrically insulate active components that are formed as part of a FEOL (front-end-of-line) layer on an active surface of the semiconductor substrate. A STI structure is designed to prevent or reduce the flow of leakage current into the semiconductor substrate and to prevent other types of electrical interactions between active devices and components. Semiconductor fabrication process flows typically implement a STI recess process in which an upper surface of a STI layer is recessed before further processing can take place. In semiconductor devices where different patterns of device structures are formed on the semiconductor substrate, recessing the STI layer to a target level is a challenging process because the recess level of the STI layer can vary over the surface of the semiconductor substrate depending on the pattern density of structures in different regions. In particular, the recess level in a given region is dependent on the pattern density of the structures and the amount of space (e.g., pitch) between the structures in the given region. The variation in recess level of a STI layer is due to micro-loading effects of conventional etch processes whereby the STI layer is recessed deeper in regions of the semiconductor substrate having relaxed-pitch structure patterns as compared to regions of the semiconductor substrate having tight-pitch structure patterns. Thus, it is a difficult and non-trivial process to uniformly recess (or etch back) a STI layer on a semiconductor substrate having different densities of structure patterns. The non-uniform recess of a STI layer due to loading effects of conventional etch processes can result in undesired variation in device dimensions, which leads to undesired variation in device performance.

SUMMARY

Embodiments of the invention include methods for fabricating uniform thickness shallow trench isolation layers as part of a process flow for fabricating vertical FET devices, as well as semiconductor devices comprising shallow trench isolating layers with uniform thickness.

One embodiment of the invention includes a method for fabricating a semiconductor device. The method comprises: forming semiconductor device structures in a first device region of a semiconductor substrate, wherein the semiconductor structures in the first device region are spaced apart at a pitch P; forming semiconductor device structures in a second device region of the semiconductor substrate, wherein the first and second device regions are separated by an isolation region with a spacing S, wherein S is greater than P; forming a first insulating layer over the semiconductor structures in the first and second device regions; recessing the first insulating layer to a target depth in the first device region, wherein recessing the first insulating layer results in recessing a portion of the first insulating layer in the isolation region between the first and second device region to a depth that is lower than the target depth; forming a first etch stop layer over the recessed first insulating layer; depositing a second insulating layer over the first etch stop layer in the first and second device regions to increase a level of insulating material in the isolation region to the target depth of the first insulating layer in the first device region; and patterning the second insulating layer to form a uniform thickness shallow trench isolation layer which comprises the recessed first insulating layer, a portion of the first etch stop layer, and the patterned second insulating layer.

Another embodiment of the invention includes a semiconductor device. The semiconductor device comprises semiconductor device structures formed in a first device region of a semiconductor substrate and semiconductor structures formed in a second device region of the semiconductor substrate. The semiconductor structures in the first device region are spaced apart at a pitch P, and the first and second device regions are separated by an isolation region with a spacing S, wherein S is greater than P. The device further comprises a first insulating layer formed over the semiconductor structures in the first and second device regions, wherein the first insulating layer is recessed to a target depth in the first device region, and recessed to a second depth in the isolation region between the first and second device region, wherein the second depth is lower than the target depth. The device further comprises a first etch stop layer formed over the recessed first insulating layer, and a second insulating layer formed over the first etch stop layer in the first and second device regions. The second insulating layer increases a level of insulating material in the isolation region to the target depth of the first insulating layer in the first device region. The recessed first insulating layer, the first etch stop layer, and the second insulating layer collectively form a uniform thickness shallow trench isolation layer.

Other embodiments will be described in the following detailed description of embodiments, which is to be read in conjunction with the accompanying figures.

BRIEF DESCRIPTION OF THE DRAWINGS

FIGS. 2 through 15 schematically illustrate a method for fabricating the semiconductor device of FIG. 1 according to an embodiment of the invention, wherein:

FIG. 2 is a cross-sectional schematic side view of the semiconductor device at an intermediate stage of fabrication in which layer of dielectric material is formed on a semiconductor substrate;

FIG. 3 is a cross-sectional schematic side view of the semiconductor structure of FIG. 2 after patterning the layer of dielectric material to form a first hard mask which is used to etch the semiconductor substrate;

FIG. 6 is a cross-sectional schematic side view of the semiconductor structure of FIG. 5A after forming a layer of semiconductor material over the planarized surface of the semiconductor structure, and depositing and patterning a layer of dielectric material to form a second hard mask which is used to etch the layer of semiconductor material;

FIG. 8 is a cross-sectional schematic side view of the semiconductor structure of FIGS. 7A and 7B after depositing and planarizing a second layer of insulating material down to the second hard mask;

FIG. 9 is a cross-sectional schematic side view of the semiconductor structure of FIG. 8 after recessing the first and second layers of insulating material down to a target depth below the plate structures;

FIG. 10 is a cross-sectional schematic side view of the semiconductor structure of FIG. 9 after depositing a layer of insulating material to form a first etch stop layer;

FIG. 11 is a cross-sectional schematic side view of the semiconductor structure of FIG. 10 after depositing a third layer of insulating material to increase a thickness of the insulating material in isolation regions adjacent to the first and second device regions R1 and R2 to the target depth below upper surfaces of the plate structures;

FIG. 12 is a cross-sectional schematic side view of the semiconductor structure of FIG. 11 after depositing a layer of insulating material to form a second etch stop layer;

FIG. 13 is a cross-sectional schematic side view of the semiconductor structure of FIG. 12 after planarizing the surface of the semiconductor structure down to the first etch stop layer on the upper regions of the vertical semiconductor fins;

FIG. 14 is a cross-sectional schematic side view of the semiconductor structure of FIG. 13 after recessing exposed portions of the third insulating layer down to the second etch stop layer; and FIG. 15 is a cross-sectional schematic side view of the semiconductor structure of FIG. 14 after recessing exposed portions of the first and second etch stop layers down to the upper surfaces of the first and third layers of insulating material.

DETAILED DESCRIPTION

Figure 1:
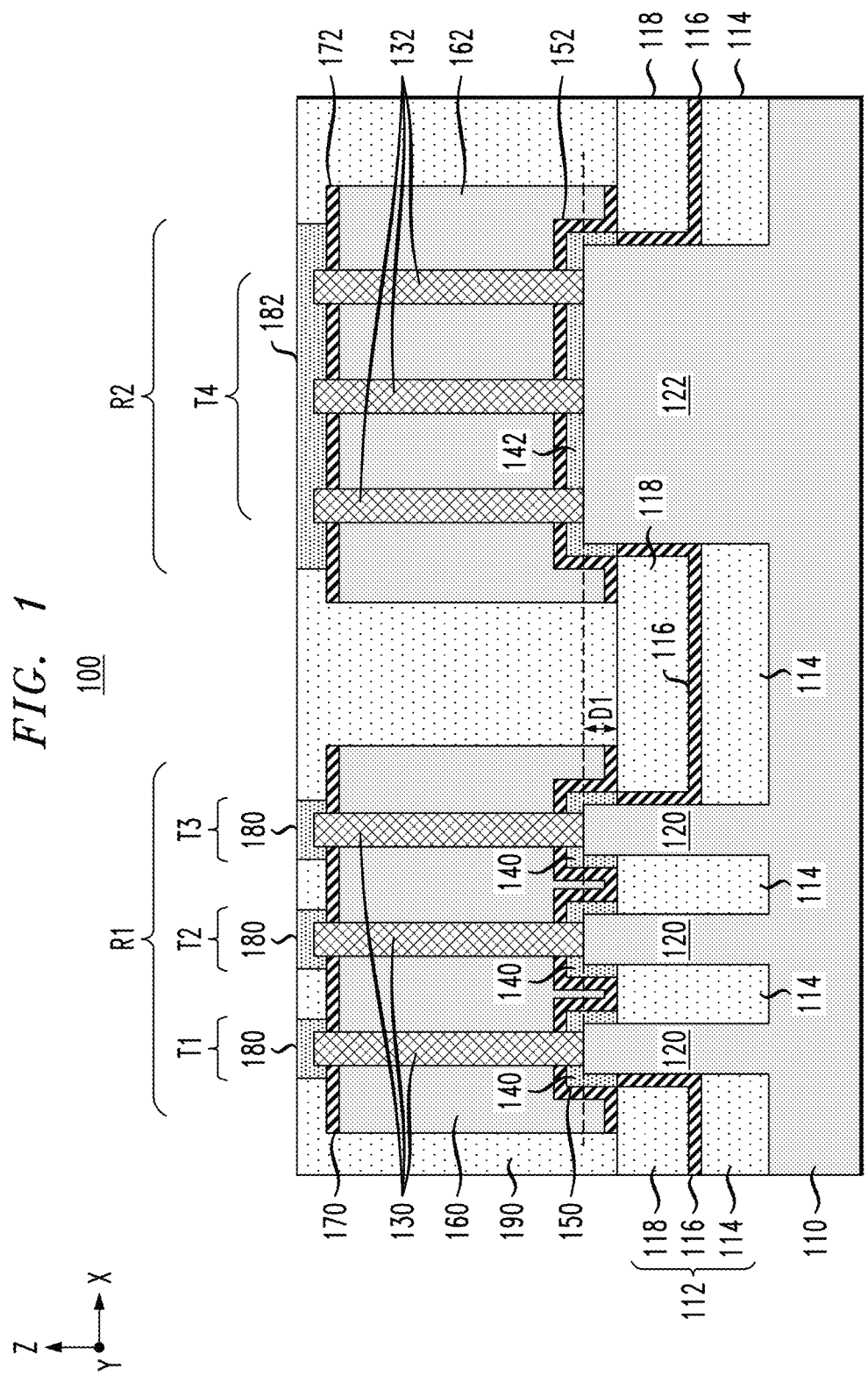
FIG. 1 is a schematic cross-sectional side view of a semiconductor device comprising a uniform thickness shallow trench isolation layer for vertical FET devices, according to an embodiment of the invention.

Embodiments of the invention will now be described with regard methods for fabricating uniform thickness shallow trench isolation layers as part of a process flow for fabricating vertical FET devices, as well as semiconductor devices comprising shallow trench isolating layers with uniform thickness. As explained in further detail below, embodiments of the invention provide methods to resolve non-uniform STI recessing which can result in devices regions with different feature pattern densities due to microloading effects when etching down a layer of insulating material in the device regions with different feature pattern densities.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the term "vertical" or "vertical direction" or "vertical height" as used herein denotes a Z-direction of the Cartesian coordinates shown in the drawings, and the terms "horizontal," or "horizontal direction," or "lateral direction" as used herein denotes an X-direction and/or Y-direction of the Cartesian coordinates shown in the drawings.

FIG. 1 is a schematic cross-sectional side view of a semiconductor device 100 comprising a uniform thickness shallow trench isolation layer for vertical FET devices, according to an embodiment of the invention. The semiconductor device 100 comprises a semiconductor substrate 110, and a STI layer 112 which comprises a first insulating layer 114, a second insulating layer 116 (alternatively referred to as etch stop layer), and a third insulating layer 118. The semiconductor device 100 further comprises a plurality of plate structures 120 and vertical semiconductor fins 130 formed in a first device region R1, and a single plate structure 122 and vertical semiconductor fins 132 formed in a second device region R2. In one embodiment, the plate structures 120 and 122 are formed by patterning a surface of the semiconductor substrate 110.

The first device region R1 of the semiconductor device 100 further comprises lower source/drain regions 140, a lower insulating spacer 150, a metal gate structure 160, an upper insulating spacer 170, and upper source/drain regions 180. The second device region R2 of the semiconductor device 100 further comprises a lower source/drain region 142, a lower insulating spacer 152, a metal gate structure 162, an upper insulating spacer 172, and an upper source/drain region 182. It is to be understood that the term "source/drain region" as used herein means that a given source/drain region can be either a source region or a drain region, depending on the application or circuit configuration.

In the example embodiment of FIG. 1, the first device region R1 comprises three separate vertical FET devices T1, T2, and T3, wherein each vertical FET device T1, T2, and T3 is formed on a separate plate structure 120, and wherein each vertical FET device T1, T2, and T3 comprises a corresponding lower source/drain region 140, vertical semiconductor fin 130, and upper source/drain region 180. The vertical FET devices T1, T2, and T3 in the first device region R1 commonly share the metal gate structure 160. Moreover, in the example embodiment of FIG. 1, the second device region R2 comprises a single, multi-fin vertical FET device T4 which comprises three vertical semiconductor fins 132 formed on the single plate structure 122, wherein the three vertical semiconductor fins 132 are commonly connected to the lower source/drain region 152, the upper source/drain region 182, and the metal gate structure 162. In this configuration, the three vertical semiconductor fins 132 comprise three channel segments which are connected in parallel via the lower and upper source/drain regions 142 and 182 to collectively form the single, multi-fin vertical FET device T4. As further shown in FIG. 1, the vertical FET devices T1, T2, T3, and T4 are embedded in a layer of insulating material 190 (e.g., a PMD (pre-metal dielectric) layer).

As shown in FIG. 1, the STI layer 112 comprises a uniform thickness over the first and second device regions R1 and R2, wherein an upper surface of the STI layer 112 is uniformly recessed to a target depth D1 below an upper surface of the plate structures 120 and 122 in the first and second device regions R1 and R2. In the example embodiment of FIG. 1, the lower source/drain regions 140 are epitaxially grown on upper portions of the plate structures 120 which are exposed by the STI layer 112, and the lower source/drain region 142 is epitaxially grown on an upper portion of the plate structure 122 which is exposed by the STI layer 112. In this regard, the thickness of the recessed STI layer 112 defines the active height (e.g., D1) of the upper portion of the plate structures 120 and 122 on which the lower source/drain regions 140 and 142 are epitaxially grown.

In the example embodiment of FIG. 1, it is desirable to ensure that the recess level D1 of the STI layer 112 is uniform over the first and second device regions R1 and R2 so that the lower source/drain regions 140 and 142, which are formed on the exposed upper portions of the plate structures 120 and 122, can be formed with uniform dimensions (e.g., same height on exposed upper sidewall surfaces of the plate structures 120 and 122). In conventional process flows, the deposition and etch back of a single layer of insulating material over the plate structures 120/122 and vertical semiconductor fins 130/132 would result in a non-uniform recess of the single layer of insulating material due to micro-loading effects, as the tighter pitch density of the individual stacked plate/vertical fin structures 120/130 would result in a different recess depth of the insulating material in the regions between adjacent stacked plate/vertical fin structures 122/132, as compared to other regions which have a more relaxed pitch density of patterned features (see, e.g., FIG. 9). In one example embodiment of the invention, the STI layer 112 is formed with multiple layers of insulating material (114, 116, 118) which are deposited and patterned using a process flow that enables the formation of the uniformly thick STI layer 112 as shown in FIG. 1.

Methods for fabricating the semiconductor device 100 shown in FIG. 1 will now be discussed in further detail with reference to FIG. 2 through FIG. 15, which schematically illustrate the semiconductor device 100 at various stages of fabrication. To begin, FIG. 2 is a cross-sectional schematic side view of the semiconductor device at an intermediate stage of fabrication in which a layer of dielectric material 111 is formed on a semiconductor substrate 110. While the semiconductor substrate 110 is generically illustrated in FIG. 2, the semiconductor substrate 110 may comprise one of different types of semiconductor substrate structures. For example, in one embodiment, the semiconductor substrate 110 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 110 may comprise a SOI (silicon on insulator) substrate, which comprises an insulating layer (e.g., oxide layer) disposed between a base substrate layer (e.g., silicon substrate) and an active semiconductor layer (e.g., silicon layer, SiGe layer, III-V compound semiconductor layer, etc.) in which active circuit components (e.g., vertical FET devices) are formed as part of a FEOL layer.

The layer of dielectric material 111 comprises silicon nitride (SiN) or any other dielectric material that is suitable for use of etch hard mask. A next step in the illustrative fabrication process comprises patterning the layer of dielectric material 111 to form a first hard mask that is used to etch a pattern of plate structures in the surface of the semiconductor substrate 110. For example, FIG. 3 is a cross-sectional schematic side view of the semiconductor structure of FIG. 2 after patterning the layer of dielectric material 111 to form a first hard mask 111-1. The layer of dielectric material 111 can be patterned using standard photolithography techniques. For example, a layer of photoresist material is deposited on top of the layer of dielectric material 111 and lithographically patterned (exposed and developed) to form a photoresist mask having a target pattern which is to be transferred to the layer of dielectric material 111. An etch process is then performed using the photoresist mask to etch exposed portions of the layer of dielectric material 111 down to the surface of the semiconductor substrate 110 and thereby form the first hard mask 111-1. The etch process can be performed using a dry etch process such as RIE (reactive ion etching) or other etch processes with etching chemistries that are suitable to etch the layer of dielectric material 111.

Figure 4A:
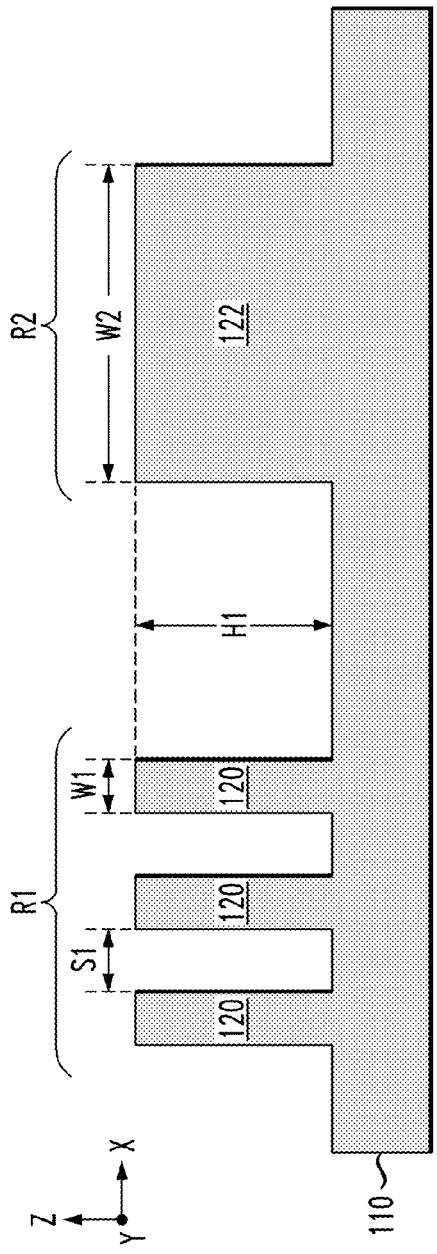
FIGS. 4A and 4B are schematic views of the semiconductor structure of FIG. 3 after patterning the semiconductor substrate using the first hard mask to form plate structures in a first device region and a second device region.
Figure 4B:
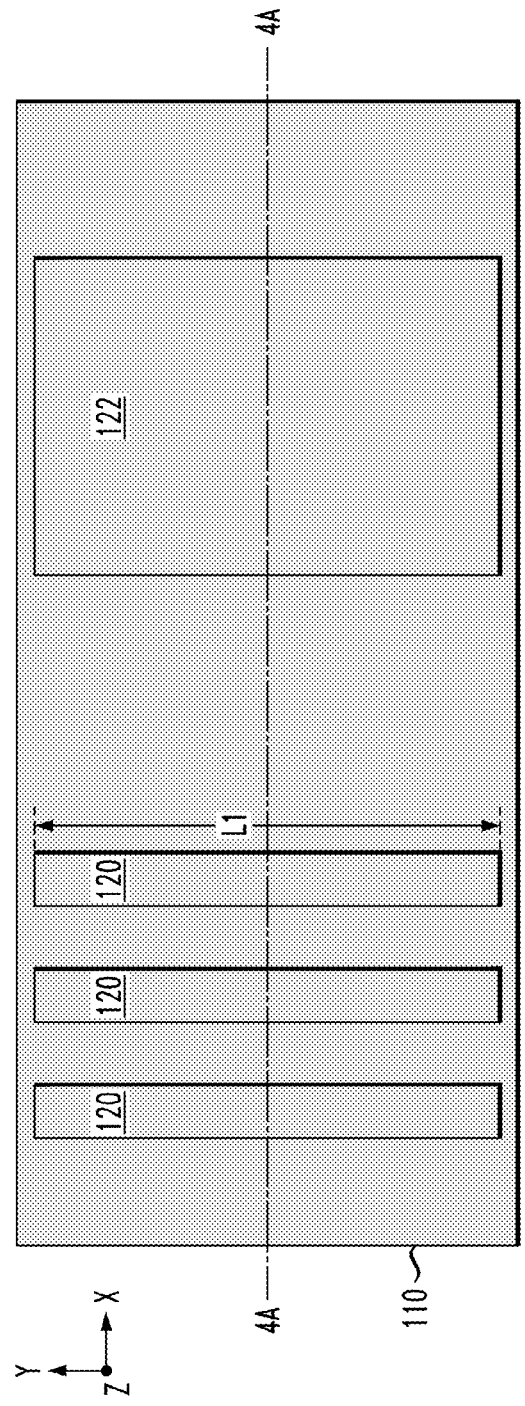

FIGS. 4A and 4B schematically illustrate the semiconductor structure of FIG. 3 after patterning the semiconductor substrate 110 using the first hard mask 111-1 to form the plate structures 120 and 122 in the first and second device regions R1 and R2, respectively. FIG. 4B is a schematic top plan view of the semiconductor structure of FIG. 4A, and FIG. 4A is a cross-sectional view of the semiconductor structure along line 4A-4A in FIG. 4B. The semiconductor substrate 110 can be etched using a directional RIE etch (anisotropic etch) with an etch chemistry that is suitable to etch the semiconductor material of the semiconductor substrate 110 selective to the first hard mask 111-1. As shown in FIGS. 4A and 4B, the plate structures 120 in the first device region R1 are formed with a width W1, height H1, and length L1, and are spaced by a distance S1. Further, the plate structure 122 in the second device region R2 is formed to have a width W2, which is greater than W1. The plate structure 122 has a height H1 and length L1 which is the same as the plate structures 120 in the first device region R1. In one example embodiment, the width W1 is in a range of about 10 nm to about 20 nm, the width W2 is in a range of about 100 nm to about 200 nm, the height H1 is in a range of about 30 nm to about 100 nm, and the length L1 is in a range of about 50 nm to about 1000 nm.

Figure 5A:
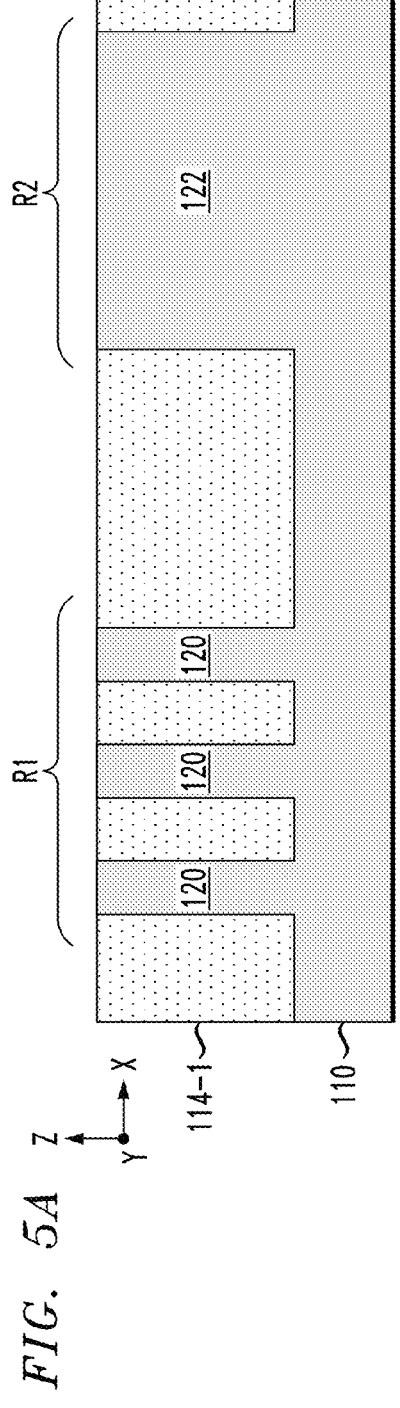
FIGS. 5A and 5B are schematic views of the semiconductor structure of FIGS. 4A and 4B after removing the first hard mask, depositing a first layer of insulating material over the semiconductor structure, and planarizing the first layer of insulating material down to an upper surface of the plate structures.
Figure 5B:
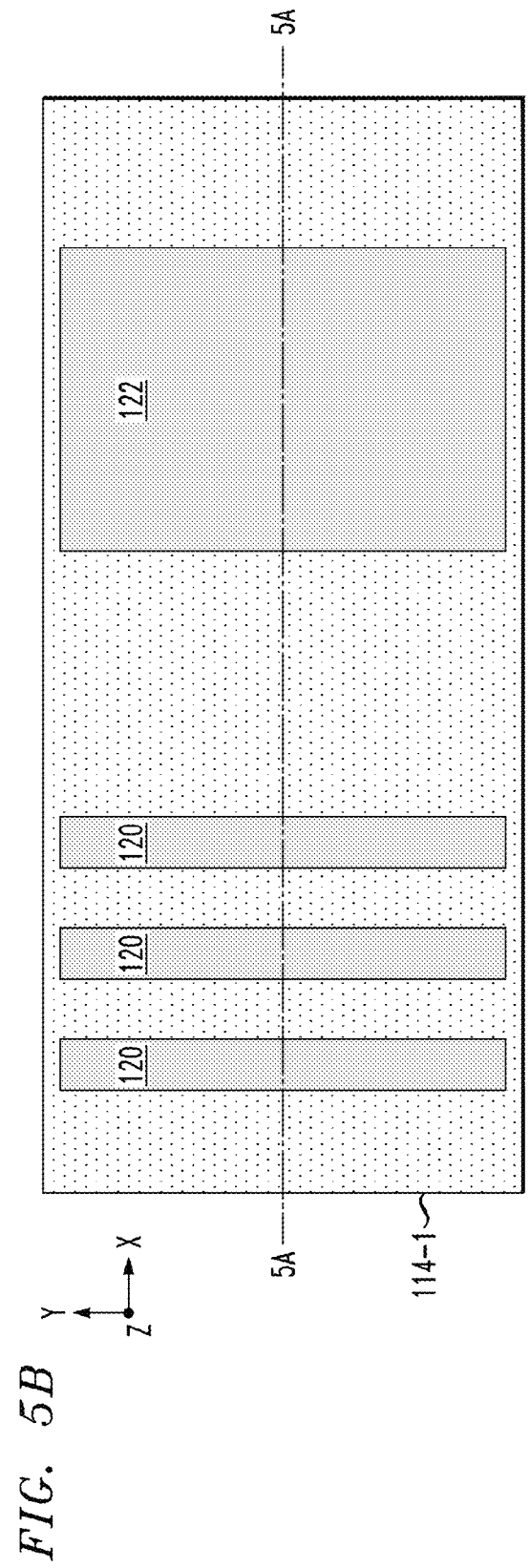

FIGS. 5A and 5B are schematic views of the semiconductor structure of FIGS. 4A and 4B after removing the first hard mask 111-1, depositing a first layer of insulating material 114-1 over the semiconductor structure, and planarizing the first layer of insulating material 114-1 down to an upper surface of the plate structures 120 and 122. FIG. 5B is a schematic top plan view of the semiconductor structure of FIG. 5A, and FIG. 5A is a cross-sectional view of the semiconductor structure along line 5A-5A in FIG. 5B. The first layer of insulating material 114-1 may comprise any suitable dielectric material that is commonly utilized in FEOL process technologies including, but not limited to, silicon oxide (e.g. $SiO_2$), silicon nitride (e.g., $Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The first insulating layer 114-1 may be deposited using known deposition techniques, such as, for example, ALD (atomic layer deposition), CVD (chemical vapor deposition) PECVD (plasma-enhanced CVD), or PVD (physical vapor deposition), or spin-on deposition.

Figure 6:
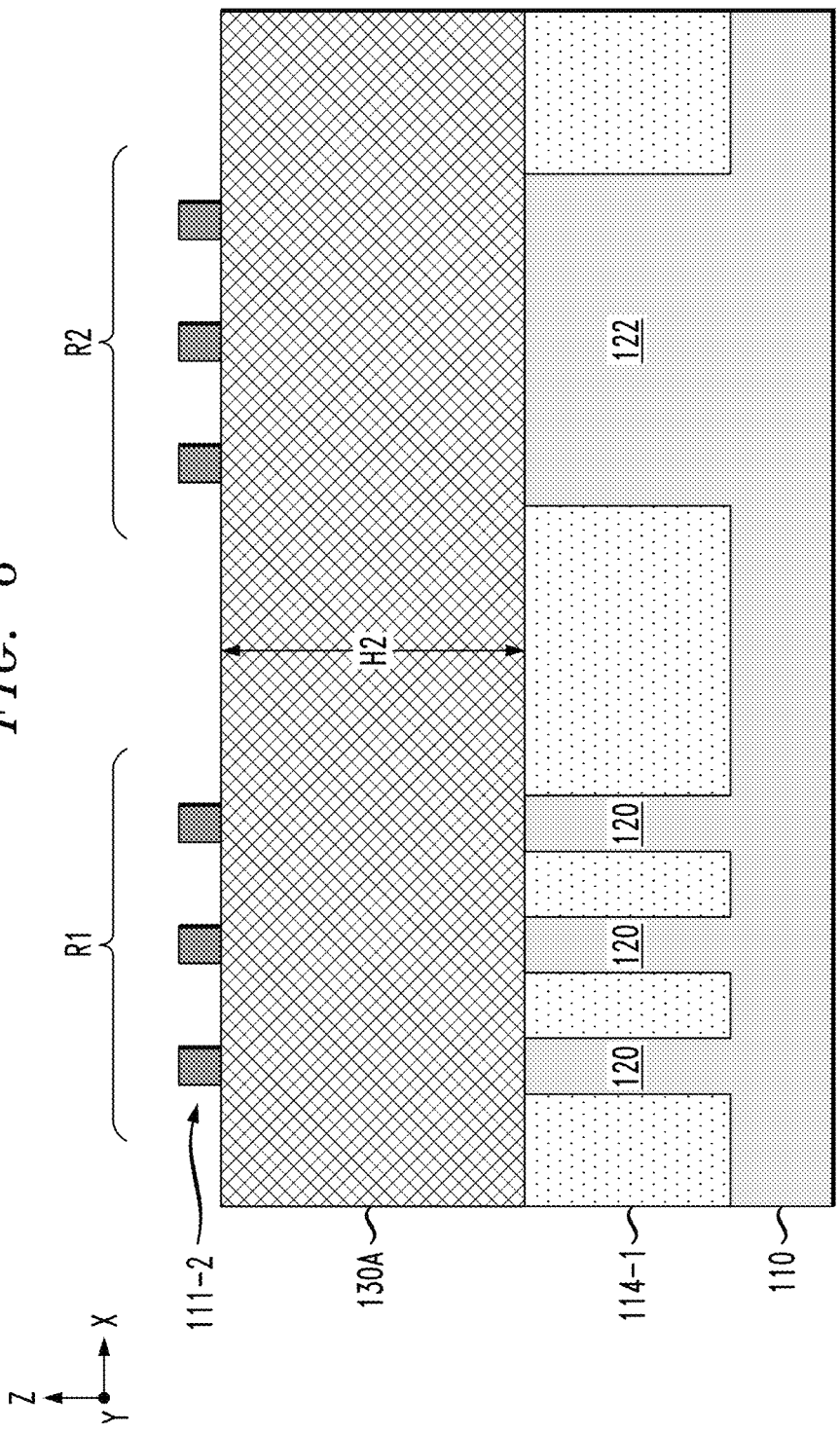
Figure 7A:
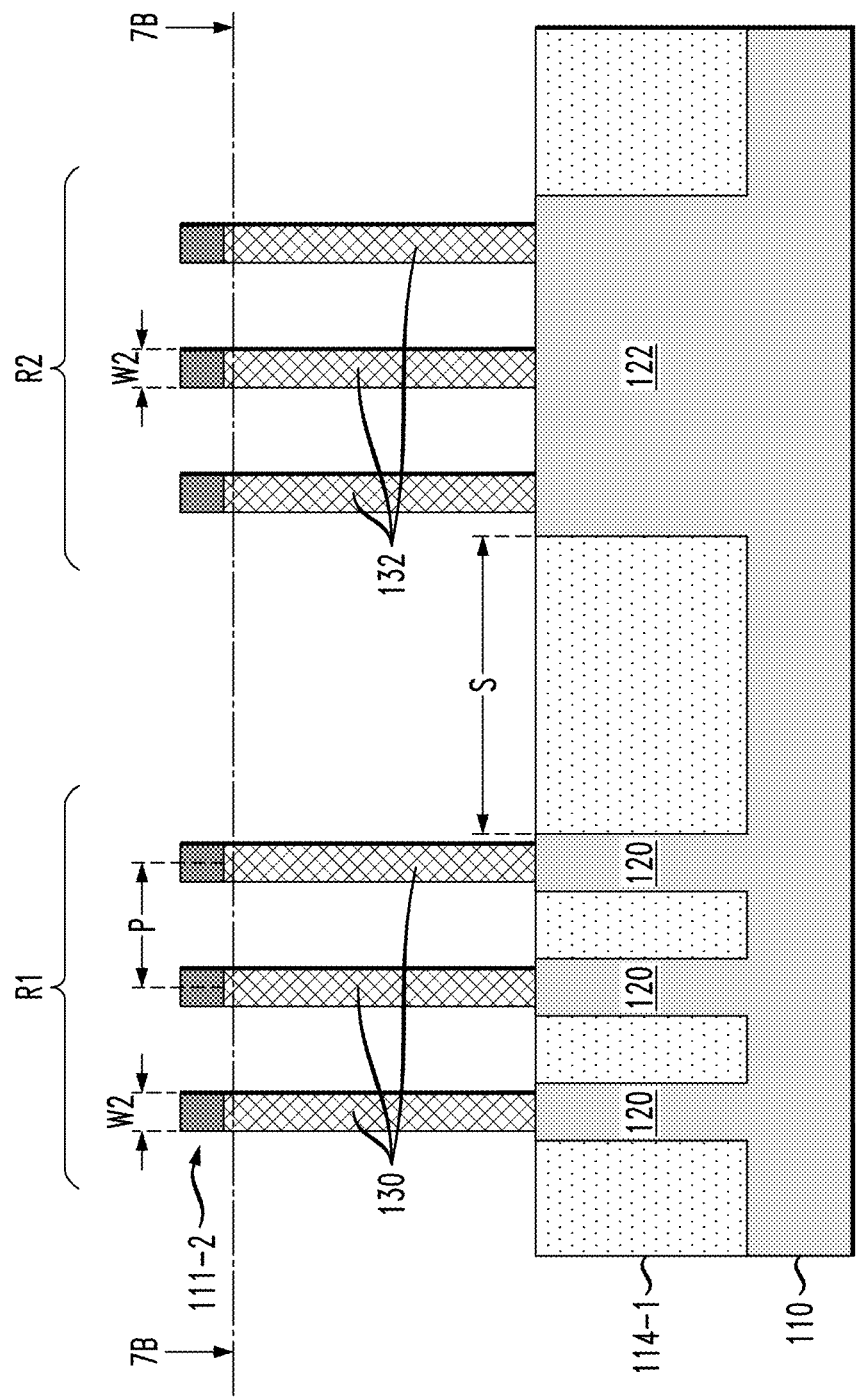
FIGS. 7A and 7B are schematic views of the semiconductor structure of FIG. 6 after etching the layer of semiconductor material to form vertical semiconductor fins on the plate structures in the first and second device regions.
Figure 7B:
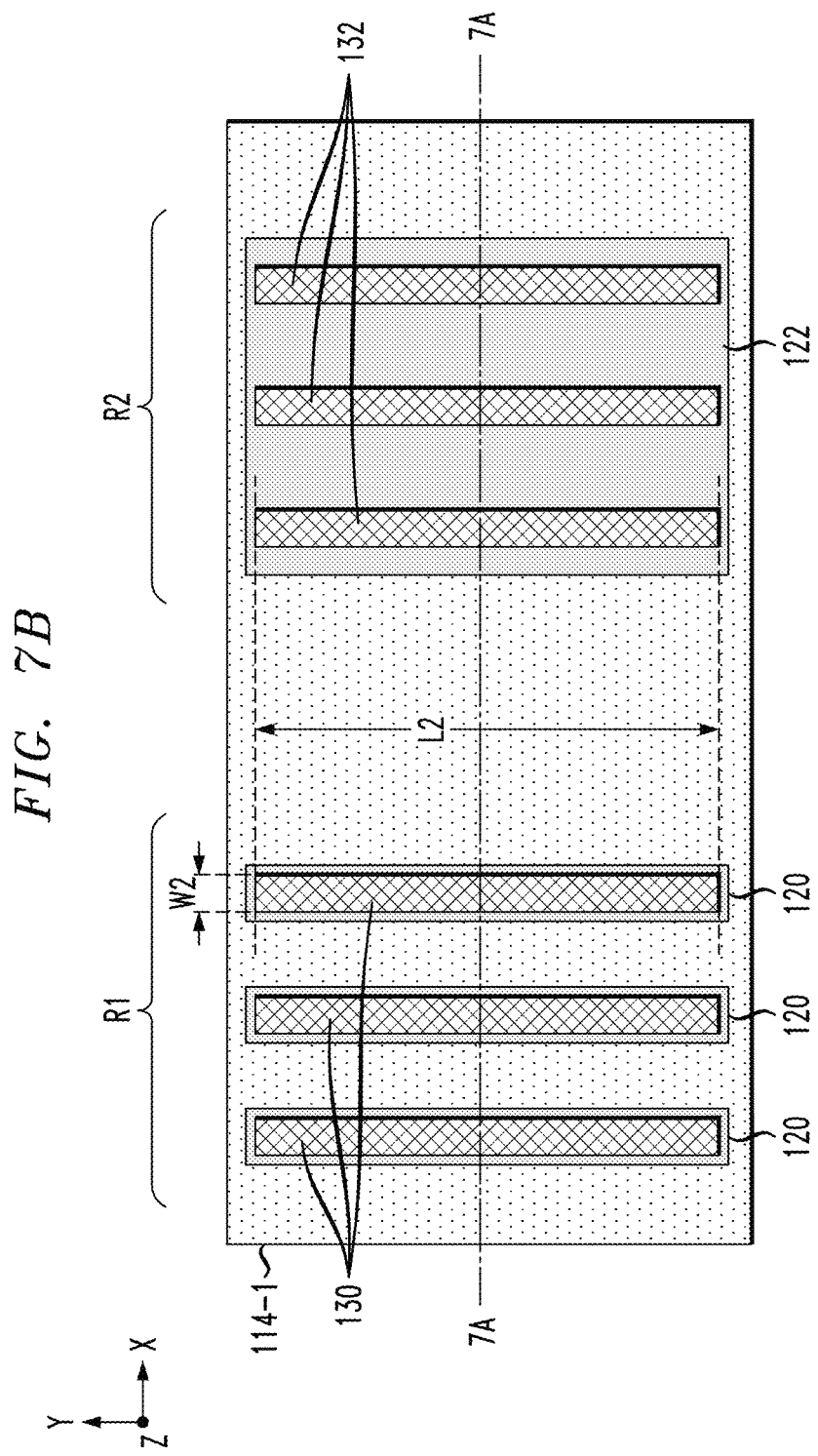

A next phase of the semiconductor fabrication process comprises forming vertical semiconductor fins on the plate structures 120 and 122 using a process flow as schematically illustrated in FIGS. 6, 7A, and 7B. In particular, FIG. 6 is a cross-sectional schematic side view of the semiconductor structure of FIG. 5A after forming a layer of semiconductor material 130A over the planarized surface of the semiconductor structure, and depositing and patterning a layer of dielectric material (e.g., SiN) to form a second hard mask 111-2 which is used to etch the layer of semiconductor material 130A to form vertical semiconductor fins. The layer of semiconductor material 130A may comprise a crystalline silicon material, or other types of semiconductor materials that are commonly used to form vertical semiconductor fins for vertical FET devices such as germanium, a silicon-germanium alloy, a compound semiconductor material (e.g. III-V material), etc. The layer of semiconductor material 130A can be deposited or epitaxially grown using known methods such as CVD, MOCVD (metal-organic CVD), LPCVD (Low Pressure CVD), MBE (molecular beam epitaxy), VPE (vapor-phase epitaxy), or other known epitaxial growth techniques which are suitable for the given process flow. In one embodiment, the layer of semiconductor material 130A is formed with a thickness (denoted H2 in FIG. 6) in a range of about 50 nm to about 100 nm, wherein the thickness of the layer of semiconductor material 130A defines a height (H2) of the vertical semiconductor fins subsequently formed on the plate structures 120 and 122.

Next, FIGS. 7A and 7B are schematic views of the semiconductor structure of FIG. 6 after forming the vertical semiconductor fins 130 and 132 on the plate structures 120 and 122, respectively, in the first and second device regions R1 and R2. FIG. 7A is a schematic cross-sectional view of the semiconductor structure along line 7A-7A in FIG. 7B, and FIG. 7B is a schematic top plan view of the semiconductor structure along line 7B-7B in FIG. 7A. The vertical semiconductor fins 130 and 132 can be formed by anisotropically etching the layer of semiconductor material 130A with a dry etch plasma process (e.g., RIE) with an etch chemistry that is suitable to etch the layer of semiconductor material 130A selective to the material of the second hard mask 111-2. As shown in FIGS. 7A and 7B, the vertical semiconductor fins 130 and 132 are formed with a width W2 and length L2, which are slightly less than the width W1 and length L1 dimensions of the plate structures 120 and 122. The vertical semiconductor fins 130 and 132 are formed with a height H2, which is defined by the thickness of the layer of semiconductor material 130A (FIG. 6). As further shown in FIG. 7A, the individual device structures 120/130 are spaced apart at a pitch P, and the device regions R1 and R2 are separated by an isolation region of distance S, wherein P is less than S.

Figure 8:
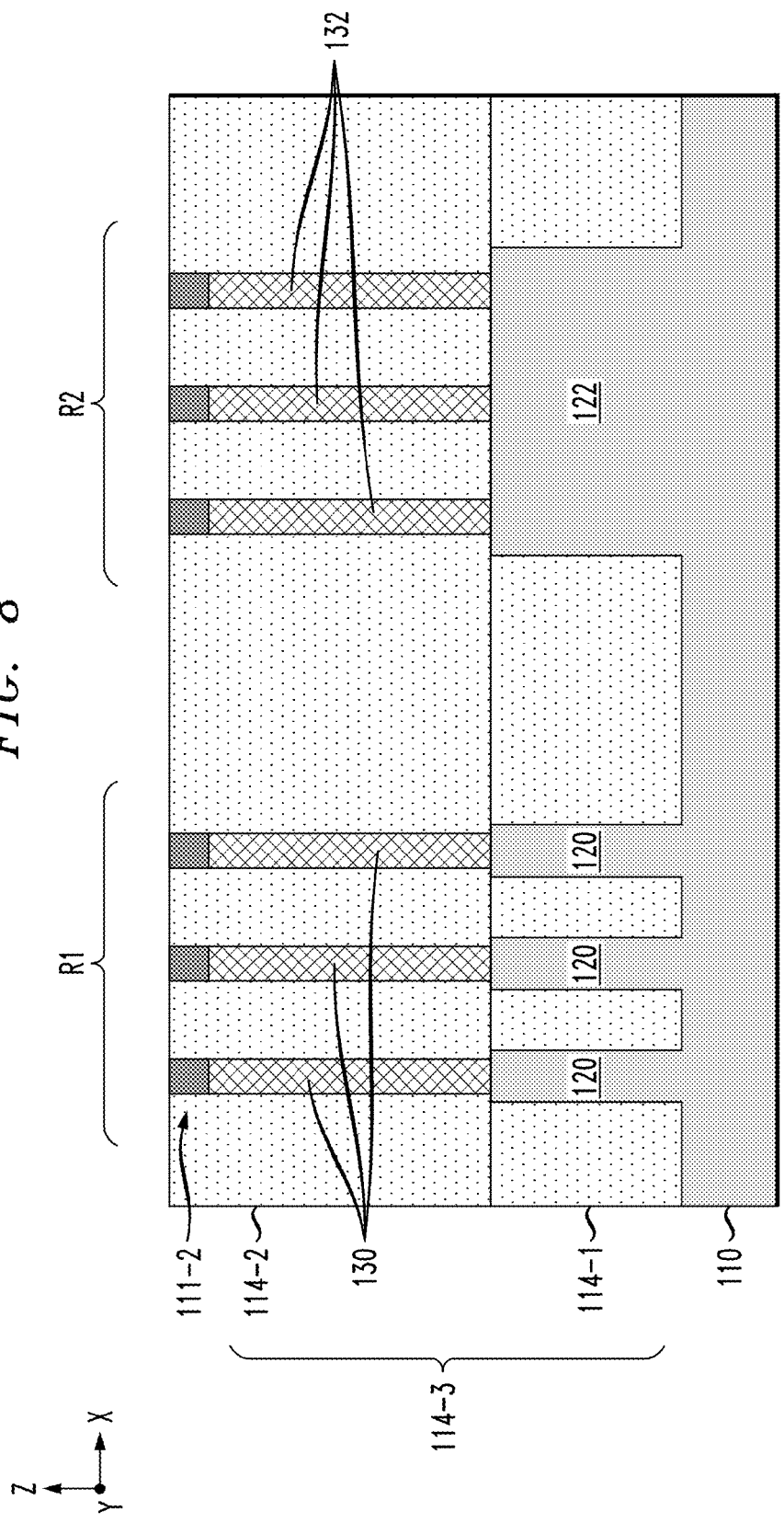

Next, FIG. 8 is a cross-sectional schematic side view of the semiconductor structure of FIGS. 7A and 7B after depositing and planarizing a second layer of insulating material 114-2 down to the second hard mask 111-2. In one embodiment of the invention, the second layer of insulating material 114-2 is formed of the same material (e.g., silicon oxide) as the first layer of insulating material 114-1. The first and second layers of insulating material 114-1 and 114-2 collectively form an ILD (interlevel dielectric) layer 114-3 that is recessed to form the first insulating layer 114 of the STI layer 112 of the semiconductor device 100 (FIG. 1). The second layer of insulating material 114-2 is formed to provide a planarized surface as a baseline for a timed etch to recess the ILD layer 114-3 down to a target depth, as shown in FIG. 9.

Figure 9:
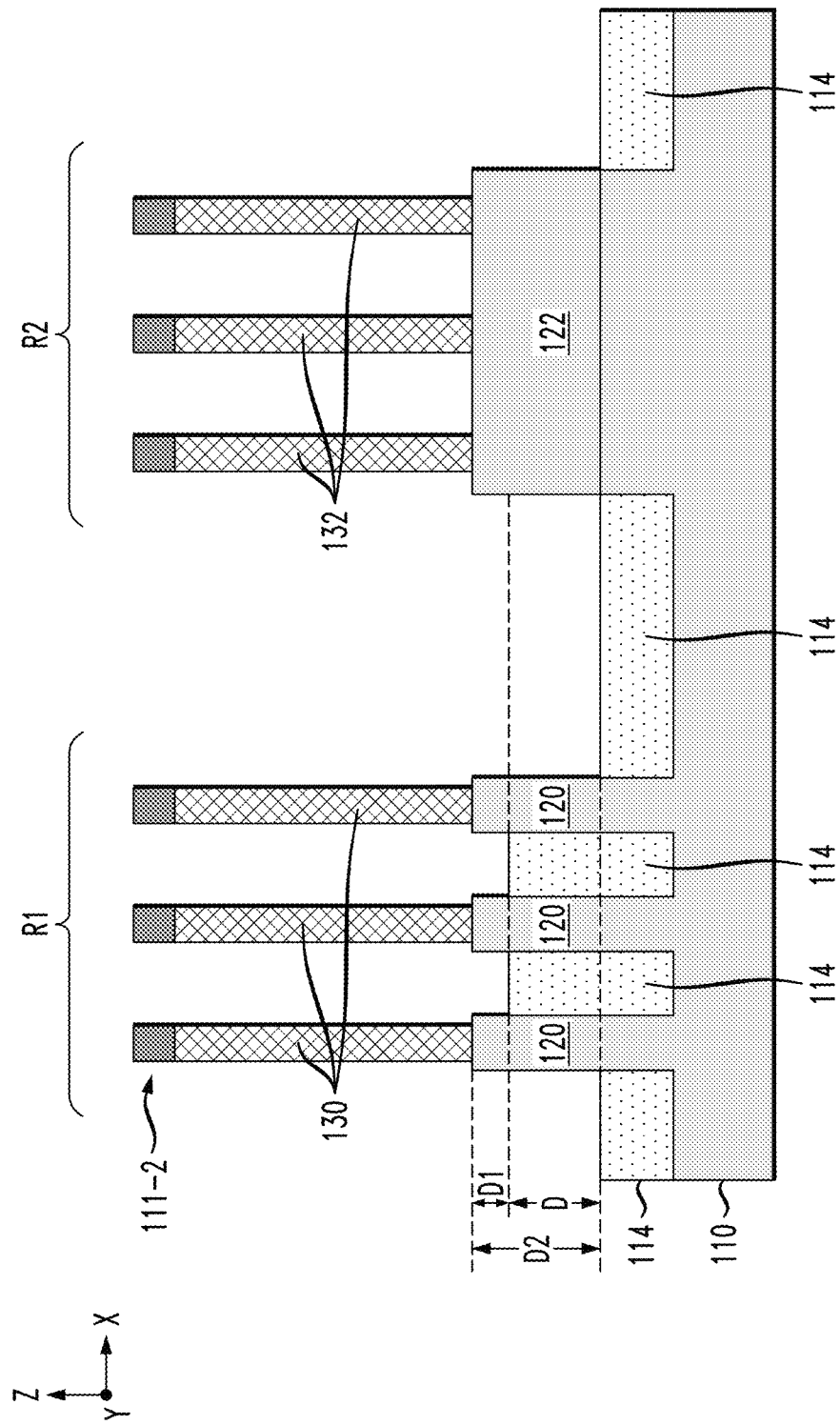

In particular, FIG. 9 is a cross-sectional schematic side view of the semiconductor structure of FIG. 8 after etching the ILD layer 114-3 down to a target depth D1 below the plate structures 120 in the first device region R1 to form the first insulating layer 114 of the STI layer 112 (FIG. 1). In one embodiment, the ILD etch process is performed using a dry etch process, such as RIE, with an etch chemistry that is selective to the semiconductor materials of the plate structures 120 and 122, the vertical semiconductor fins 130 and 132, and the second hard mask 111-2. With this etch process, the ILD layer 114-3 is recessed down to the target depth D1 below the upper surfaces of the plate structures 120 in the first device region R1, while the ILD layer 114-3 is recessed down to a lower depth D2 below the upper surfaces of the plate structures 120 and 122 in the isolation regions adjacent to the first and second device regions R1 and R2.

In particular, as shown in FIG. 9, to achieve a target depth D1 in the first device region R1, the ILD layer 114-3 is recessed to the lower depth D2 in the isolation regions adjacent to the device regions R1 and R2 due to microloading effects of the RIE etch process, which causes the ILD layer 114-3 to be recessed deeper (e.g., depth D2) in areas with a lower density of patterned features (e.g., isolation region of distance S between the adjacent plate structures 120 and 122), as compared to the shallower recess depth (e.g., depth D1) which results in areas with higher density (smaller pitch) of patterned features (e.g., spaces between adjacent plate/vertical fin structures 120/130). In certain instances, a differential depth D between the recessed depths D2 and D1 can be in a range of 30 nm to 40 nm. This variation in recess depth of the ILD layer 114-3 results in the formation of the first insulating layer 114 of the STI layer 112 with a non-uniform thickness (e.g., portions of the first insulating layer 114 between adjacent plate structures 120 are thicker than portions of the first insulating layer 114 adjacent to the device regions R1 and R2).

As a result of the non-uniform thickness of the first insulating layer 114, the amount of exposure of the upper sidewalls of the plate structures 120 and 122 varies, which is undesirable for forming the lower epitaxial source/drain regions on the upper regions of the plate structures 120 and 122. Indeed, if the first insulating layer 114 shown in FIG. 9 was utilized as the STI layer, the size of the lower source/drain regions 140 and 142 grown on the exposed upper portions of the plate structures 120 and 122 would significantly vary, as epitaxial growth of the semiconductor material on the exposed sidewalls of the plate structures 120 and 122, which are exposed at the depth D2, would be significantly larger than the epitaxial growth of the semiconductor material on the exposed sidewalls of the plate structures 120, which are exposed at the shallower depth D1. In one embodiment, the process flow as schematically shown in FIGS. 10 through 15 is implemented to form a uniform thickness STI layer.

Figure 10:
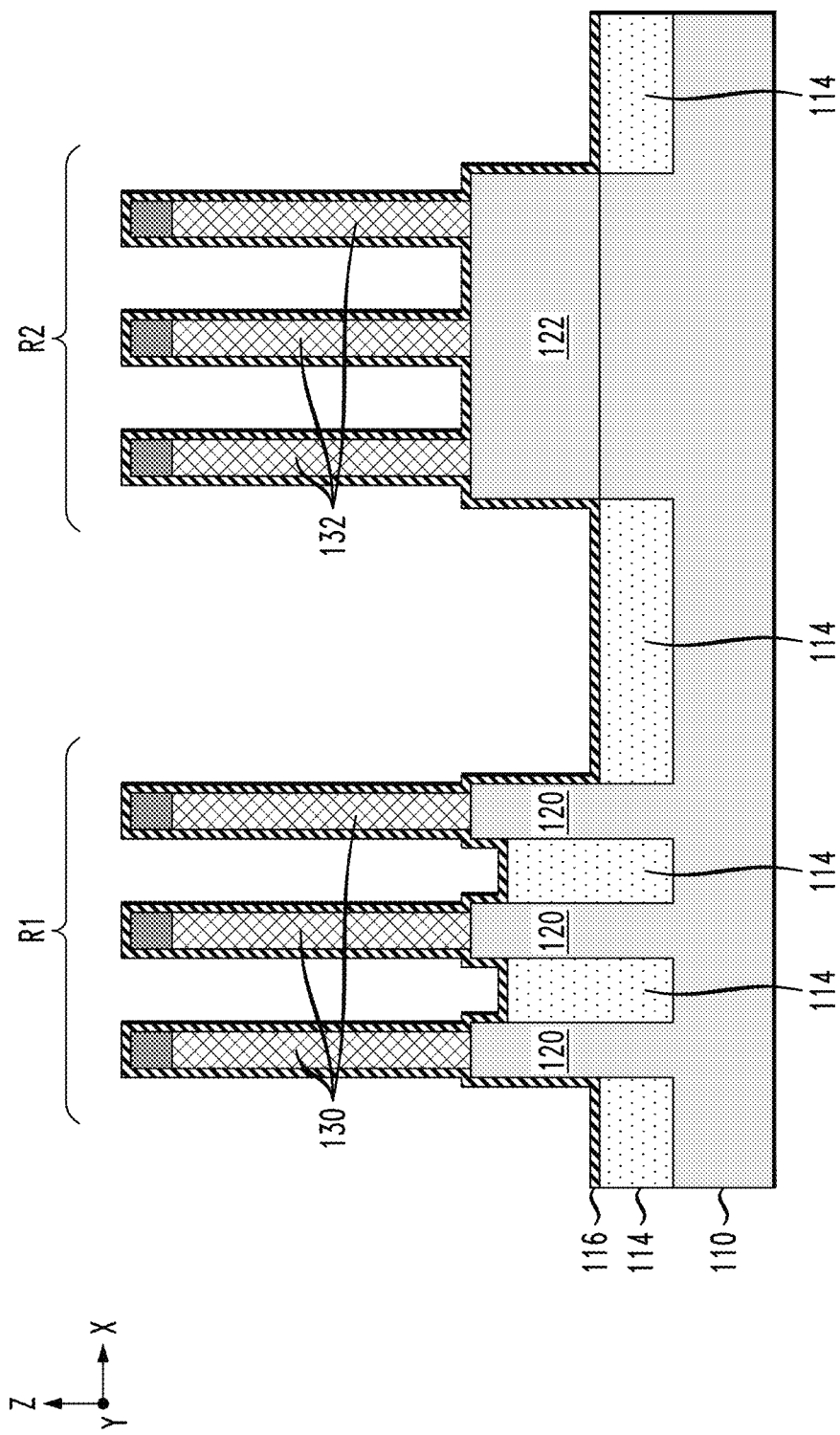

As an initial step. FIG. 10 is a cross-sectional schematic side view of the semiconductor structure of FIG. 9 after depositing a layer of insulating material to form a first etch stop layer 116. In one embodiment of the invention, the first etch stop layer 116 is formed by depositing a conformal layer of SiN, or some other type of insulating/dielectric material which can be etched selective to the materials that are used to form the insulating layers 114 and 118 of the STI layer 112 (FIG. 1). In one embodiment, the first etch stop layer 116 is formed with a thickness in a range of about 3 nm to about 5 nm. As explained in further detail below, the first etch stop layer 116 defines an active plate height (e.g., D1) for the subsequent formation of the lower source/drain regions 140 of the single vertical FET devices T1, T2, and T3 in the first device region R1.

Figure 11:
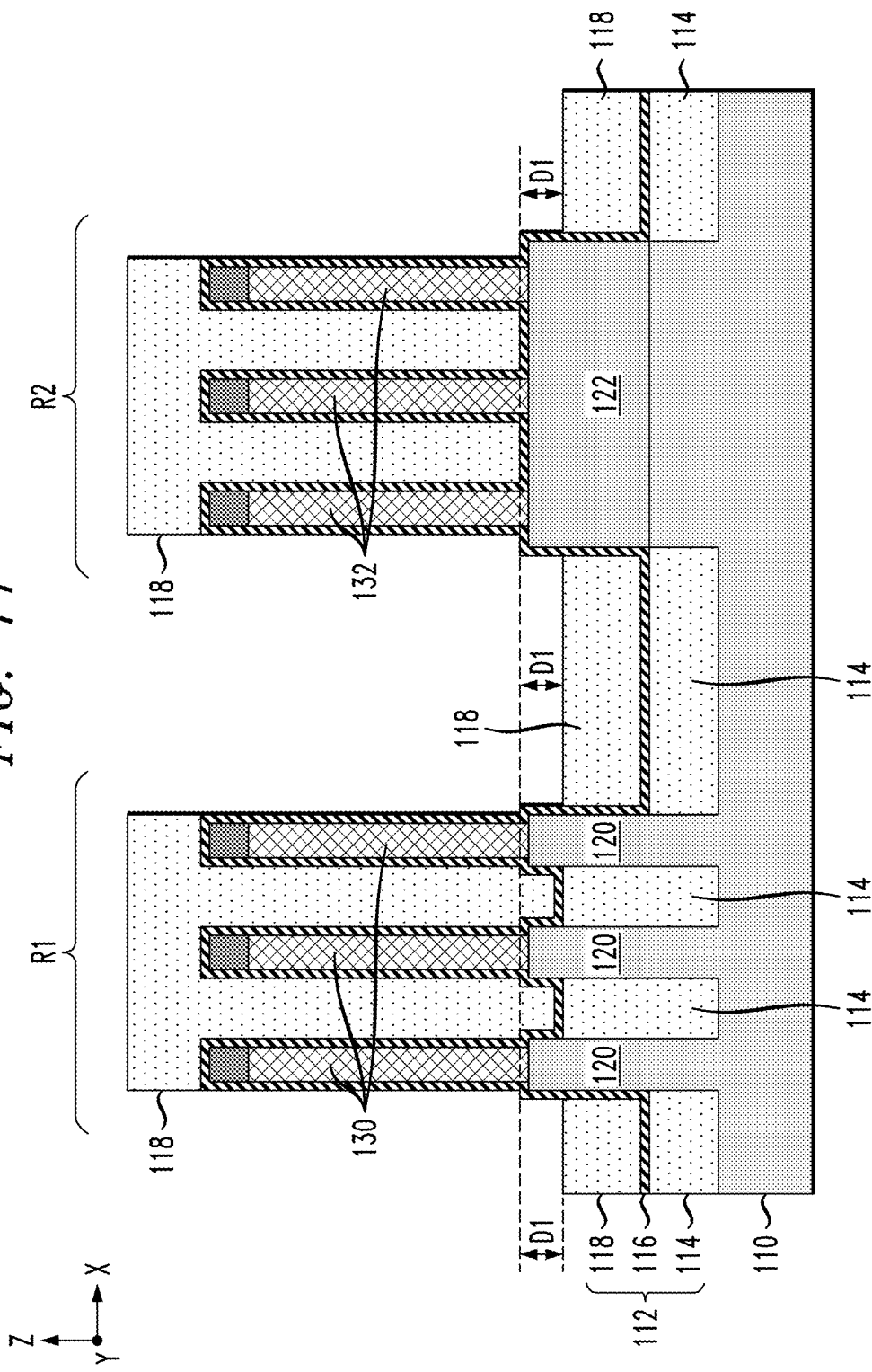

Next, FIG. 11 is a cross-sectional schematic side view of the semiconductor structure of FIG. 10 after depositing a third layer of insulating material 118 to increase a thickness of the insulating material in the isolation regions adjacent to the device regions R1 and R2 to the target depth D1 below the upper surfaces of the plate structures 120 and 122. In one embodiment of the invention, the third layer of insulating material 118 is formed of the same material (e.g., silicon oxide) as the first insulating layer 114, although other types of insulating materials may be used which can be etched selective to the material of the first etch stop layer 116. As schematically shown in FIG. 11, the third layer of insulating material 118 is deposited to refill the isolation regions adjacent to the device regions R1 and R2 with enough insulating material so that an upper surface of the layer of insulating material 118 in the isolation regions is increased to the same level (or substantially the same level) as the level of the first insulating layer 114 between the adjacent plate structures 120 in the first device region R1. As a result, as shown in FIG. 11, the upper surface of the third layer of insulating material 118 in the isolation regions adjacent to the first and second device regions R1 and R2 is increased to the target depth D1 below the upper surfaces of plate structures 120 and 122.

As further shown in FIG. 11, deposition of the third layer of insulating material 118 results in refilling the spaces between adjacent vertical semiconductor fins 130 in the first device region R1 with the insulating material 118, as well as refilling the spaces between adjacent vertical semiconductor fins 132 in the second device region R2 with the insulating material 118. During deposition of the third layer of insulating material 118, due to the high aspect ratio of the spaces between adjacent vertical semiconductor fins 130 and 132 in the device regions R1 and R2, the insulating material is deposited in the spaces between adjacent vertical semiconductor fins 130 and 132 at a faster rate than the rate at which the insulating material is deposited in the isolation regions adjacent to the device regions R1 and R2, thereby resulting in the semiconductor structure shown in FIG. 11.

Figure 12:
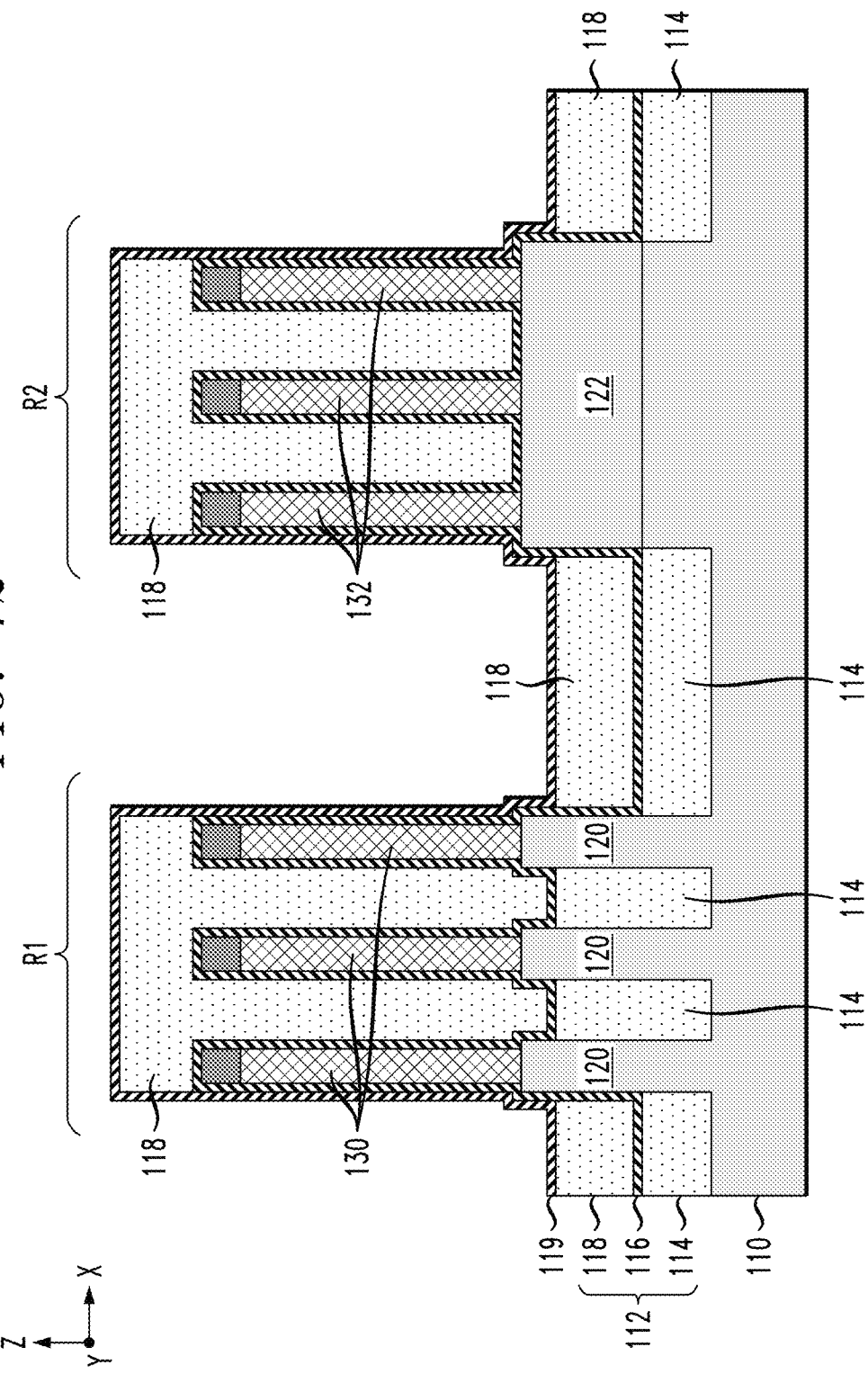

Next, FIG. 12 is a cross-sectional schematic side view of the semiconductor structure of FIG. 11 after depositing a layer of insulating material to form a second etch stop layer 119. In one embodiment, the second etch stop layer 119 is formed by depositing a conformal layer of SiN, or some other type of insulating/dielectric material which can be etched selective to the insulating material of the third insulating layer 118. In one embodiment, the second etch stop layer 119 is formed with a thickness in a range of about 3 nm to about 5 nm. As explained in further detail below, the second etch stop layer 119 defines an active plate height (e.g., D1) for the formation of the lower source/drain region 142 of the single, multi-fin vertical FET device T4 in the second device region R2.

Figure 13:
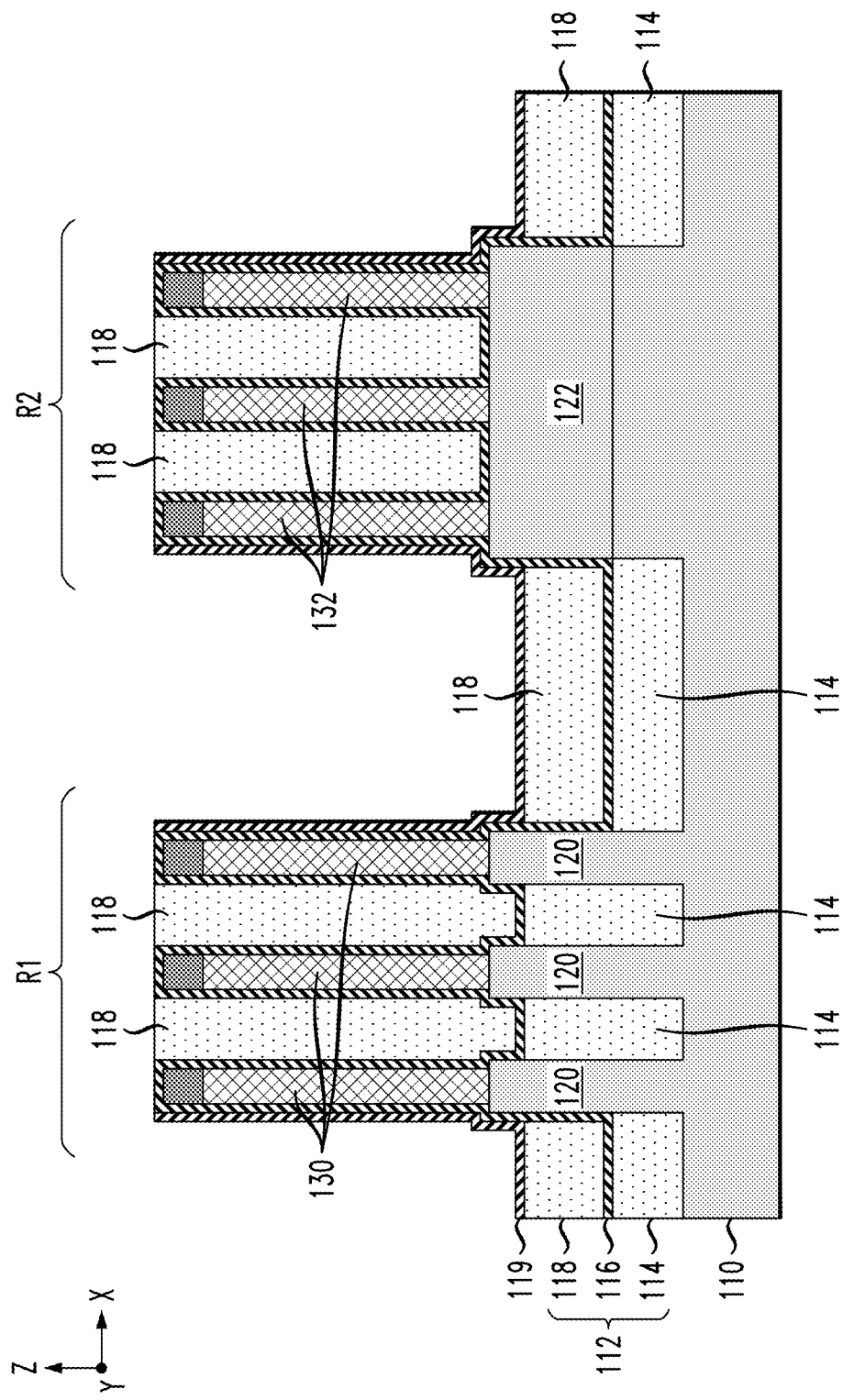

Following formation of the structure shown in FIG. 12, a CMP process is formed to remove overburden insulating material on the upper portions of the vertical semiconductor fins 130 and 132. For example, FIG. 13 is a cross-sectional schematic side view of the semiconductor structure of FIG. 12 after planarizing the surface of the semiconductor structure down to the first etch stop layer 116 on the upper regions of the vertical semiconductor fins 130 and 132. The CMP process removes the upper portions of the second etch stop layer 119 and the third insulating layer 118 down to the surface of the first etch stop layer 116 over the vertical semiconductor fins 130 and 132. The CMP process exposes portions of the third insulating layer 118 disposed between the vertical semiconductor fins 130 in the first device region R1 and between the vertical semiconductor fins 132 in the second device region R2.

Figure 14:
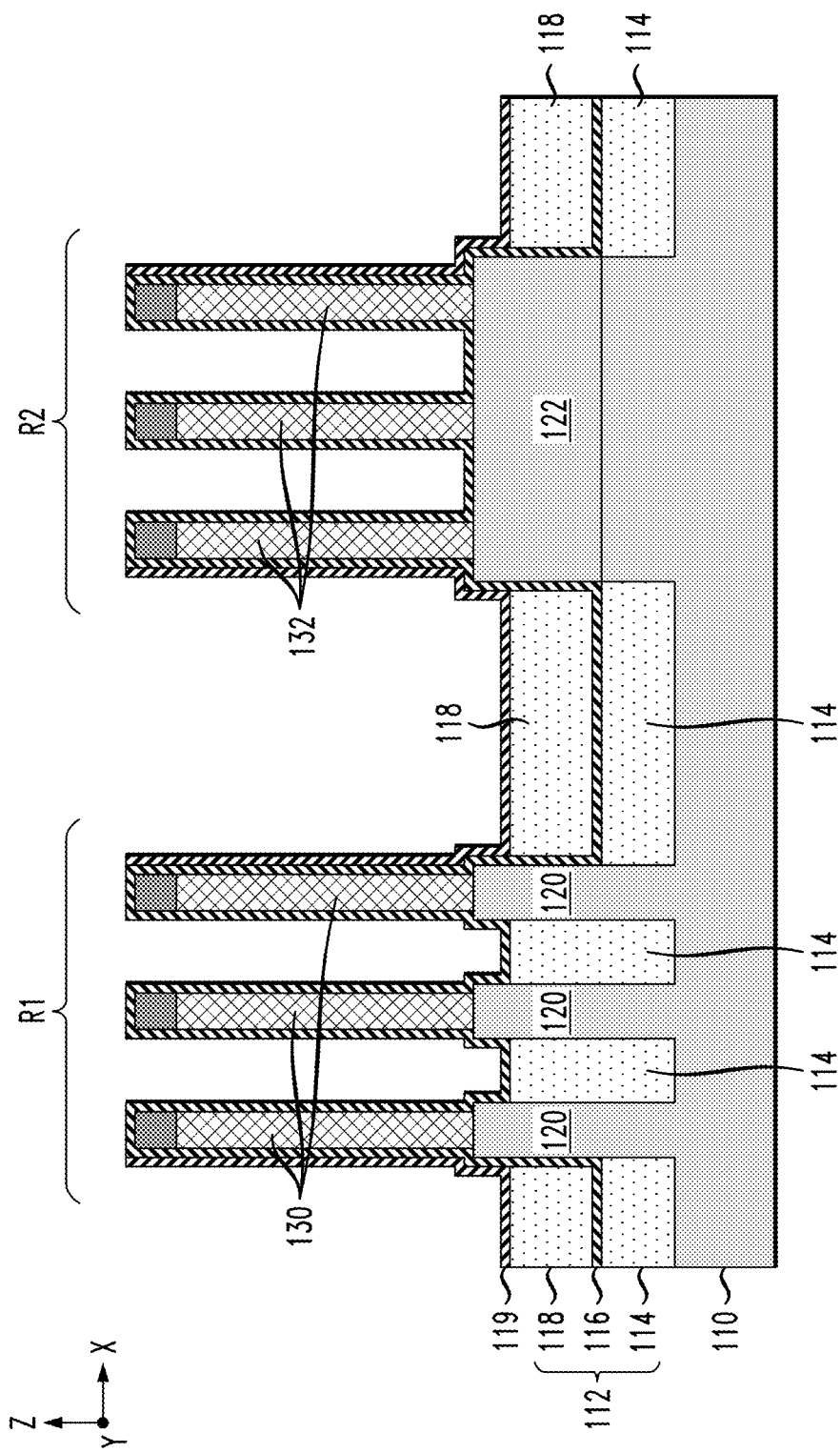

Next, FIG. 14 is a cross-sectional schematic side view of the semiconductor structure of FIG. 13 after etching the exposed portions of the third insulating layer 118 between the vertical semiconductor fins 130 and 132 down to the second etch stop layer 119. With this etch back process, the exposed portions of the third insulating layer 118 between the vertical semiconductor fins 130 and 132 are etched selective to the materials of the first and second etch stop layers 116 and 119 to prevent etching of the portions of the first and third insulating layers 114 and 118 which define the STI layer 112.

Figure 15:
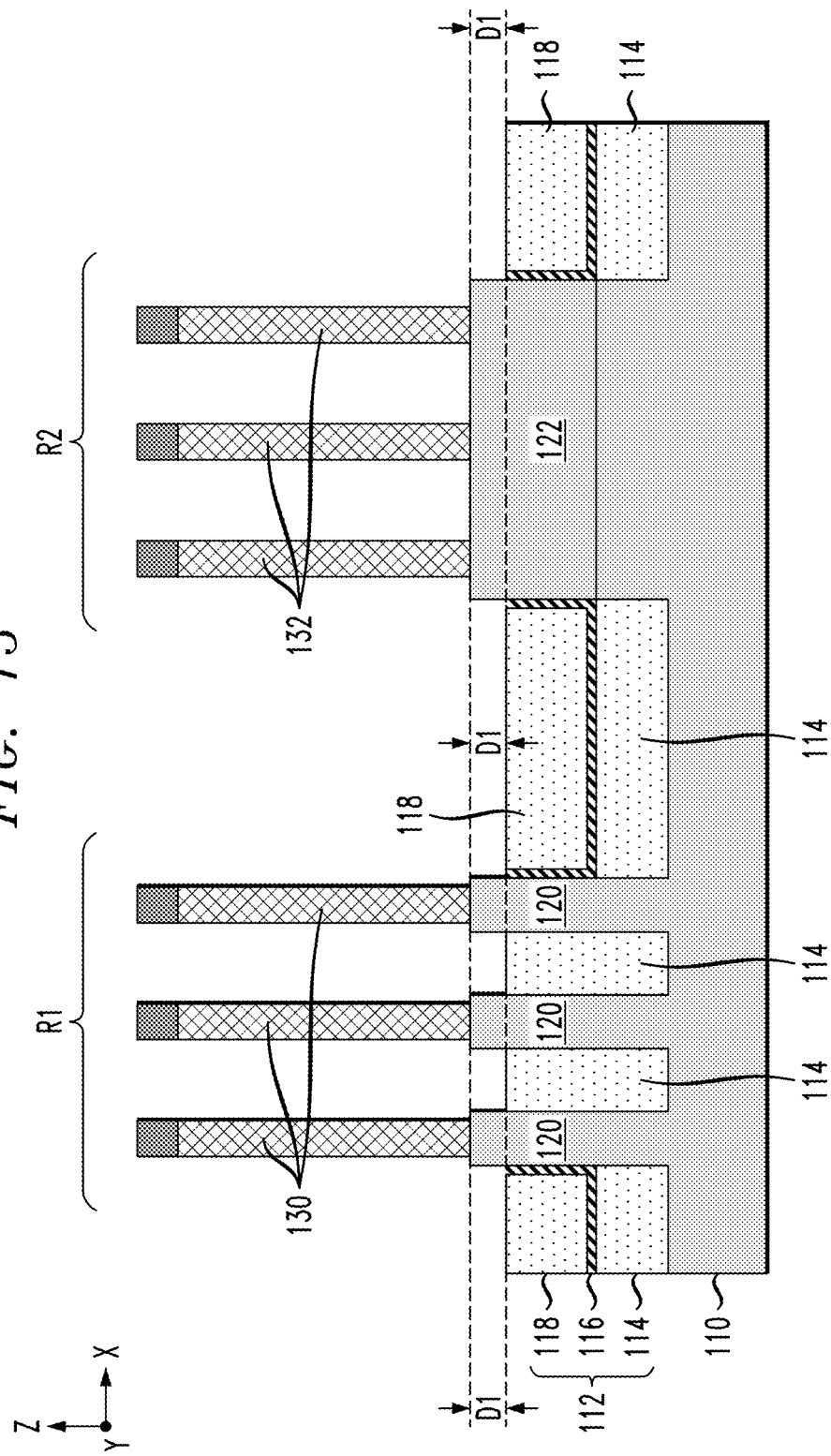

Following the etch back of the insulating material 118 disposed between the vertical semiconductor fins 130 and 132, another etch process is performed to remove the exposed portions of the first and second etch stop layers 116 and 119 selective to the insulating materials of the first and third insulating layers 114 and 118. In particular, FIG. 15 is a cross-sectional schematic side view of the semiconductor structure of FIG. 14 after recessing the exposed portions of the first and second etch stop layers 116 and 119 down to the first and third insulating layers 114 ad 118. With this process, the second etch stop layer 119 is completely removed, while a portion of the first etch stop layer 116 remains embedded between the first and third insulating layers 114 and 118 of the STI layer 112. The resulting structure shown in FIG. 15 comprises a uniform thickness STI layer 112, which is uniformly recessed to define uniform plate heights (e.g., D1) for epitaxially growing uniform source/drain regions on the upper surfaces of the plate structures 120 and 122.

Following the formation of the semiconductor structure shown in FIG. 15, any known sequence of processing steps can be implemented to complete the fabrication the semiconductor integrated circuit device as shown in FIG. 1, the details of which are not needed to understand embodiments of the invention. Briefly, by way of example, referring back to FIG. 1, FEOL processing can continue by forming the lower source/drain regions 140 and 142 on the upper surfaces of the plate structures 120 and 122. In one embodiment, lower source/drain regions 140 and 142 are formed by epitaxially growing doped semiconductor layers (e.g., doped SiGe) on the exposed upper portions of the plate structures 120 and 122 using known selective growth techniques in which epitaxial material is not selectively grown on the exposed surfaces of STI layer 112. The type of epitaxial semiconductor material that is used to form the lower source/drain regions 140 and 142 will vary depending on various factors including, but are not limited to, the type of material of the vertical semiconductor fins 130 and 132, the device type (e.g., n-type or p-type) of the vertical FET devices T1, T2, T3, and T4 in the device regions R1 and R2, etc.

Prior to formation of the lower source/drain regions 140 and 142, thin layer of gate dielectric can be deposited and patterned to form a gate dielectric layer on the sidewalls of the vertical semiconductor fins 130 and 132. The lower source/drain regions 140 and 142 may be in-situ doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the deposited film. Alternatively, the source/drain regions 140 and 142 can be doped ex-situ by ion implantation.

The lower insulating spacers 150 and 152 are then formed by depositing and patterning a layer of insulating material such as SiN, which can be etched selective to the insulating layer 118 of the STI layer 112. The metal gate structures 160 and 162 are formed by depositing and patterning one or more layers of metallic material (e.g., depositing a conformal work function metal layer on a gate dielectric layer, and a gate electrode layer on the conformal work function metal). The lower insulating spacers 150 and 152 serve to electrically insulate the lower source/drain regions 140 and 142 from the metal gate structures 160 and 162.

The upper insulating spacers 170 and 172 are formed be depositing and patterning a layer of insulating layer on the upper surface of the metal gate structures 160 and 162. The upper source/drain regions 180 and 182 are epitaxially grown on exposed upper portions of the vertical semiconductor fins 130 and 132. The upper source/drain regions 180 and 182 are electrically insulated from the metal gate structures 160 and 162 by the upper insulating spacers 170 and 172. One or more layers of insulating material are then deposited to form the PMD layer 190, which encapsulates the vertical FET devices T1, T2, T3 and T4 in insulating material. Thereafter, processing can continue to form one or more additional PMD layers over the semiconductor structure shown in FIG. 1 and then form vertical device contacts in the insulating layers (e.g., PMD layer 190) to the upper and lower source/drain regions 140, 142, 180, 182, and the metal gate structures 160 and 162 using known techniques and materials. Following formation of the device contacts, a BEOL (back end of line) interconnect structure is formed to provide connections to/between the vertical FET devices T1, T2, T3 and T4 and other active or passive devices that are formed as part of the FEOL layer.

It is to be understood that the methods discussed herein for fabricating uniform thickness STI layers for vertical FET devices can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:

forming semiconductor device structures in a first device region of a semiconductor substrate, wherein the semiconductor structures in the first device region are spaced apart at a pitch P;

forming semiconductor device structures in a second device region of the semiconductor substrate, wherein the first and second device regions are separated by an isolation region with a spacing S, wherein S is greater than P;

forming a first insulating layer over the semiconductor structures in the first and second device regions;

recessing the first insulating layer to a target depth in the first device region, wherein recessing the first insulating layer results in recessing a portion of the first insulating layer in the region between the first and second device region to a depth that is lower than the target depth;

forming a first etch stop layer over the recessed first insulating layer;

depositing a second insulating layer over the first etch stop layer in the first and second device regions to increase a level of insulating material in the isolation region to the target depth of the first insulating layer in the first device region; and patterning the second insulating layer to form a uniform thickness shallow trench isolation layer which comprises the recessed first insulating layer, a portion of the first etch stop layer, and the patterned second insulating layer;

wherein the semiconductor device structures in the first device region comprise a pattern of vertical semiconductor fins formed on top of individual plate structures, and wherein the semiconductor device structures in the second device region comprises a pattern of vertical semiconductor fins formed on top of a single plate structure.

2. The method of claim 1, wherein the plate structures in the first and second device regions are formed by patterning a surface of the semiconductor substrate.

3. The method of claim 1, wherein an upper surface of the uniform thickness shallow trench isolation layer is formed at a uniform depth below an upper surface of each of the plate structures in the first and second device regions.

4. The method of claim 3, further comprising epitaxially growing source/drain regions on upper portions of the plate structures in the first and second device regions, which are exposed above the uniform thickness shallow trench isolation layer.

5. The method of claim 1, wherein recessing the first insulating layer to a target depth in the first device region comprises recessing the first insulating layer to a target depth below the upper surfaces of the plate structures in the first device region.

6. The method of claim 5, wherein depositing the second insulating layer over the first etch stop layer in the first and second device regions to increase the level of insulating material in the isolation region to the target depth of the first insulating layer in the first device region comprises depositing insulating material over the first etch stop layer until the insulating material reaches a same target depth below the upper surface of the plate structure in the second device region as the target depth of the first insulating layer below the upper surfaces of the plate structures in the first device region.

7. A method for fabricating a semiconductor device, comprising:
   forming semiconductor device structures in a first device region of a semiconductor substrate, wherein the semiconductor structures in the first device region are spaced apart at a pitch P;
   forming semiconductor device structures in a second device region of the semiconductor substrate, wherein the first and second device regions are separated by an isolation region with a spacing S, wherein S is greater than P;
   forming a first insulating layer over the semiconductor structures in the first and second device regions;
   recessing the first insulating layer to a target depth in the first device region, wherein recessing the first insulating layer results in recessing a portion of the first insulating layer in the region between the first and second device region to a depth that is lower than the target depth;
   forming a first etch stop layer over the recessed first insulating layer;
   depositing a second insulating layer over the first etch stop layer in the first and second device regions to increase a level of insulating material in the isolation region to the target depth of the first insulating layer in the first device region; and
   patterning the second insulating layer to form a uniform thickness shallow trench isolation layer which comprises the recessed first insulating layer, a portion of the first etch stop layer, and the patterned second insulating layer, wherein patterning the second insulating layer to form the uniform thickness shallow trench isolation layer comprises;
      patterning a second etch stop layer to expose a portion of the second insulating layer to be removed;
      recessing the exposed portion of the second insulating layer down to the first etch stop layer; and
      etching the second etch stop layer selective to the first and second insulating layers.

8. The method of claim 7, wherein etching the second etch stop layer comprises completely removing the second etch stop layer.

9. The method of claim 7, further comprising etching an exposed portion of the first etch stop layer selective to the first and second insulating layers.

10. A semiconductor device, comprising:
    semiconductor device structures formed in a first device region of a semiconductor substrate, wherein the semiconductor structures in the first device region are spaced apart at a pitch P;
    semiconductor device structures formed in a second device region of the semiconductor substrate, wherein the first and second device regions are separated by an isolation region with a spacing S, wherein S is greater than P;
    a first insulating layer formed over the semiconductor structures in the first and second device regions, wherein the first insulating layer is recessed to a target depth in the first device region, and recessed to a second depth in the isolation region between the first and second device region, wherein the second depth is lower than the target depth;
    a first etch stop layer formed over the recessed first insulating layer; and
    a second insulating layer formed over the first etch stop layer in the first and second device regions, wherein the second insulating layer increases a level of insulating material in the isolation region to the target depth of the first insulating layer in the first device region;
    wherein the recessed first insulating layer, the first etch stop layer, and the second insulating layer collectively form a uniform thickness shallow trench isolation layer;
    wherein the semiconductor device structures in the first device region comprises a pattern of vertical semiconductor fins formed on top of individual plate structures, and wherein the semiconductor device structures in the second device region comprises a pattern of vertical semiconductor fins formed on top of a single plate structure.

11. The semiconductor device of claim 10, wherein the plate structures in the first and second device regions are formed by patterning a surface of the semiconductor substrate.

12. The semiconductor device of claim 10, wherein an upper surface of the uniform thickness shallow trench isolation layer is formed at a uniform depth below an upper surface of each of the plate structures in the first and second device regions.

13. The semiconductor device of claim 12, further comprising source/drain regions epitaxially grown on upper portions of the plate structures in the first and second device regions, which are exposed above the uniform thickness shallow trench isolation layer.

14. The semiconductor device of claim 13, further comprising:
    lower insulating spacers formed over the source/drain regions in the first and second device regions;
    metal gate structures formed on sidewalls of the vertical semiconductor fins in the first and second device regions;
    upper insulating spacers formed on the metal gate structures in the first and second device regions; and
    upper source/drain regions formed on upper portions of the vertical semiconductor fins in the first and second device regions.

15. The semiconductor device of claim 10, wherein the first insulating layer is recessed to the target depth in the first device region below the upper surfaces of the plate structures in the first device region.

16. The semiconductor structure of claim 15, wherein the second insulating layer is formed over the first etch stop layer in the first and second device regions to increase the level of insulating material in the isolation region to a same target depth below the upper surface of the plate structure in the second device region as the target depth of the first insulating layer below the upper surfaces of the plate structures in the first device region.

17. The semiconductor structure of claim 10, wherein the first and second insulating layers are formed of a same insulating material.

18. The semiconductor device of claim 10, wherein the semiconductor structures formed in the first and second device region are components of vertical FET (field effect transistor) devices.

\* \* \* \* \*